(12) United States Patent
Lai et al.

(10) Patent No.: US 12,044,723 B2
(45) Date of Patent: Jul. 23, 2024

(54) CIRCUIT FOR TEMPERATURE STRESS TEST FOR MEMORY CHIPS

(71) Applicant: Shanghai Huali Integrated Circuit Corporation, Shanghai (CN)

(72) Inventors: Zhenan Lai, Shanghai (CN); Junsheng Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 17/880,182

(22) Filed: Aug. 3, 2022

(65) Prior Publication Data
US 2023/0079961 A1  Mar. 16, 2023

(30) Foreign Application Priority Data
Aug. 31, 2021 (CN) .......................... 202111010611.0

(51) Int. Cl.
*G01R 31/28* (2006.01)
(52) U.S. Cl.
CPC ..... *G01R 31/2856* (2013.01); *G01R 31/2874* (2013.01)
(58) Field of Classification Search
CPC ............ G01R 31/2628; G01R 31/2856; G01R 31/2858; G01R 31/2874; G01R 31/2642; G01R 31/2621; G01R 31/2855; G01R 31/2879; G01R 31/2623; G01R 31/2851; G01R 31/26; G01R 31/2619; G01R 31/261; G01R 31/2639; G01R 31/2853; G01R 31/2831; G01R 31/3187; G01R 31/30; G01R 31/3193; G06F 11/3058; G06F 2119/08; G06F 30/333; G06F 30/36; G06F 30/398; G01K 7/00; G01K 7/346; G05B 2219/45031; H01L 22/34; G11C 11/41; G11C 29/06
See application file for complete search history.

(56) References Cited

U.S. PATENT DOCUMENTS

| | | | |
|---|---|---|---|
| 6,879,177 B1 * | 4/2005 | Bolam | G01R 31/2879 324/762.09 |
| 7,504,847 B2 * | 3/2009 | Goodnow | G01R 31/2856 324/762.01 |
| 7,642,864 B2 * | 1/2010 | Chuang | H03K 3/0315 324/649 |
| 7,849,426 B2 * | 12/2010 | Goodnow | G06F 30/36 716/106 |

(Continued)

*Primary Examiner* — Vinh P Nguyen
(74) *Attorney, Agent, or Firm* — Alston & Bird LLP

(57) ABSTRACT

A design-for-test circuit for evaluating a BTI effect is disclosed, the circuit includes a number of stress generators having logic circuits with input and output terminals. Each output terminal is connected to the grid of the device to be tested. In a stress mode, a stress input signal is selected from a frequency signal, a first direct current voltage, and a second direct current voltage, all stress output signals formed by all the stress generators comprise the first direct current voltage, a series of frequency signals with different duty cycles, and the second direct current voltage, and all the stress output signals are used in combination such that the stress times regarding the device under test within the same test time have different values, so as to evaluate the BTI effect of the device under test which has different values of the stress times.

14 Claims, 3 Drawing Sheets

(56) References Cited

U.S. PATENT DOCUMENTS

| | | | | |
|---|---|---|---|---|
| 8,456,247 B2* | 6/2013 | Kim | .................... | H03K 3/0315 |
| | | | | 331/44 |
| 8,907,687 B2* | 12/2014 | McMahon | ............. | G11C 29/06 |
| | | | | 324/750.01 |
| 9,778,313 B2* | 10/2017 | Chen | ................... | G01R 31/2855 |
| 9,817,059 B2* | 11/2017 | Kawa | ................. | G01R 31/2628 |
| 10,222,412 B2* | 3/2019 | Kang | ................. | G01R 31/2874 |
| 10,514,417 B2* | 12/2019 | Kang | ................. | H03K 3/0315 |
| 11,099,591 B1* | 8/2021 | Köse | ......................... | G05F 1/59 |

* cited by examiner

CIRCUIT FOR TEMPERATURE STRESS TEST FOR MEMORY CHIPS

CROSS-REFERENCES TO RELATED APPLICATIONS

This application claims the priority to Chinese patent application No. CN 202111010611.0, filed on Aug. 31, 2021, and entitled "DESIGN-FOR-TEST CIRCUIT FOR EVALUATING BIAS TEMPERATURE INSTABILITY EFFECT", the disclosure of which is incorporated herein by reference in entirety.

TECHNICAL FIELD

The present application relates to a semiconductor integrated circuit, in particular, to a design-for-test (DFT) circuit for evaluating a bias temperature instability (BTI) effect.

BACKGROUND

BTI is classified as one negative bias temperature instability (NBTI) and one positive bias temperature instability (PBTI). Taking NBTI as an example, the NBTI effect refers to the degradation of a series of electrical parameters caused by applying a high temperature to a PMOS transistor at a negative gate voltage. The general stress conditions for NBTI evaluation include applying an electric field to gate oxide biased at a constant temperature of 125° C. and grounded source, drain, and substrate.

The generation process of the NBTI effect mainly involves generation and passivation of positive electric charges, i.e., the generation of interface trapped charges and fixed oxide positive charges and the diffusion of diffusers. Hydrogen (H) atoms and water vapor are two main substances that may cause the NBTI effect. The conventional reaction diffusion (R-D) model attributes the generation of NBTI to the following fact: holes in an inversion layer of PMOS transistors are thermally excited under the high temperature and the negative gate voltage, then the thermally excited holes tunnel to the silicon/silica interface, which is the interface formed at the contact between the silicon in the channel region and the silicon dioxide in the gate oxide layer. There are a large number of Si—H bonds at the silicon/silicon dioxide interface, so the thermally excited holes interact with the Si—H bonds to generate H atoms, thereby leaving dangling bonds at the silicon/silicon dioxide interface. The H atoms are unstable, two H atoms quickly combine to form one hydrogen molecule, diffusing away from the silicon/silicon dioxide interface towards the silicon dioxide/gate interface, which is a connection interface layer between the gate oxide and a gate conductive material layer such as polysilicon gate. This diffusion results in a negative drift in the gate threshold voltage.

In the current process, a common method for evaluating the NBTI effect is to directly apply a voltage to a device under test (DUT) for a period of time, wherein the device under test is a PMOS transistor. The applied voltage to the device gate under test exerts a stress action on the device under test, and the duration of the application of the voltage is the stress time. For example, the stress time can be as long as more than two hours. However, one can only collect measurement data corresponding to a single stress time during the entire test time with this method, so it is insufficient to collect a large amount of measurement data. In addition, there is currently no effective technique for on-chip result observation before and after the stress action applied on a specific chip. After the reliability test is completed, if the chip function fails, it becomes necessary to determine the cause of that failure by means of a failure analysis.

BRIEF SUMMARY

The present application provides a design-for-test circuit which facilitates evaluating the BTI effect and determining the cause of the device function failures by implementing on-chip stress tests with different stress times.

The design-for-test circuit for evaluating a BTI effect provided by the present application includes:

a plurality of stress generators.

Each of the stress generators includes a plurality of input ends and a plurality of output ends, wherein the output end of each of the stress generator is connected to a gate of a corresponding device under test.

Each of the stress generators is a logic circuit, and signals of all the input ends of the stress generator are logically combined to form signals for all the output ends.

In a stress mode, any signal of each input end of the stress generator is a stress input signal, and the signal of each output end of the stress generator is a stress output signal.

The stress input signal of each input end of the stress generator is selected from a frequency signal, a first direct current voltage, and a second direct current voltage, the first direct current voltage has a first voltage value, the second direct current voltage has a second voltage value, the first voltage value is greater than the second voltage value, and the frequency signal switches between the first voltage value and the second voltage value and has a fixed duty cycle.

The stress output signal of each output end of the stress generator is one of a frequency signal, a first direct current voltage, and a second direct current voltage, and all the stress output signals formed by all the stress generators include the first direct current voltage, a series of frequency signals with different duty cycles, and the second direct current voltage.

A stress voltage value of the device under test that generates a stress action is the first voltage value or the second voltage value, and during a test, a stress time of each of the stress output signals regarding the device under test is determined by a time occupied by the stress voltage value included in a test time; and all the stress output signals are used in combination such that the stress times regarding the device under test within the same test time have a plurality of different values, so as to evaluate the BTI effect of the device under test on the basis of different stress times.

In an example, the device under test is a PMOS transistor, the BTI effect is an NBTI effect, the stress voltage value is the second voltage value, and the second voltage value is less than or equal to 0 V.

In an example, the device under test is an NMOS transistor, the BTI effect is a PBTI effect, the stress voltage value is the first voltage value, and the first voltage value is a positive voltage value.

In an example, in a measure mode, the signal of each input end of the stress generator is a test input signal, the signal of each output end of the stress generator is a test output signal, and the test output signal is a switch signal.

In an example, during a switch-on test on the device under test connected to the output end of the stress generator, the test output signals output by all the output ends of the same stress generator are ON signals.

During a switch-off test on the device under test connected to the output end of the stress generator, the test output signals output by all the output ends of the same stress generator are OFF signals.

In an example, in the measure mode, all the stress generators adopt the same test input signal and output the same test output signal.

In an example, each input end of the stress generator is provided with a multiplexer; in the stress mode, the multiplexer of the input end of the stress generator connects the input end of the stress generator with the stress input signal; and in the measure mode, the multiplexer of the input end of the stress generator connects the input end of the stress generator with the test input signal.

In an example, the device under test is an on-chip device of a product chip.

In an example, the product chip is a memory chip.

The frequency signal of the stress input signal is obtained by means of an increment or decrement of an address signal of the memory chip.

The test input signal is provided by the address signal of the memory chip.

In an example, the product chip is a logic chip, the logic chip has an input pin with a variable signal, the stress input signal is provided by several input pins with highest and lowest signal variation frequencies in the input pins, and the test input signal is provided by several input pins with highest and lowest signal variation frequencies in the input pins.

In an example, the design-for-test circuit is directly disposed on the product chip where the device under test is located; or the design-for-test circuit is disposed on a PCM module.

In an example, in a measure mode, a source of the device under test is connected to an external power, a drain of the device under test is connected to a detector, and the detector is used to detect a drain current of the device under test.

In an example, the stress generator is formed by connecting a plurality of NAND gates; or the stress generator is formed by connecting a plurality of NOR gates; or the stress generator is formed by connecting a plurality of NOR gates and NAND gates.

In an example, the stress action and test on the device under test are performed on a chip.

The design-for-test circuit for evaluating the BTI effect provided by the present application includes a plurality of stress generators. In the stress mode, the stress input signal is a variable signal, the stress input signals are logically combined to obtain the stress output signals, and one can obtain a variety of stress output signals from the plurality of stress generators. The probabilities of occurrence of the stress voltage values in different stress output signals are different, therefore a plurality of different stress times within the same test time can be obtained. The different stress times are generated such that on-chip stress can be implemented on the device under test in a plurality of stress time conditions within the same test time, facilitating evaluation of the BTI effect and determination of a device function failure cause.

BRIEF DESCRIPTION OF THE DRAWINGS

The present application is described in detail below with reference to the drawings and specific implementations.

DETAILED DESCRIPTION OF THE DISCLOSURE

Figure 1:
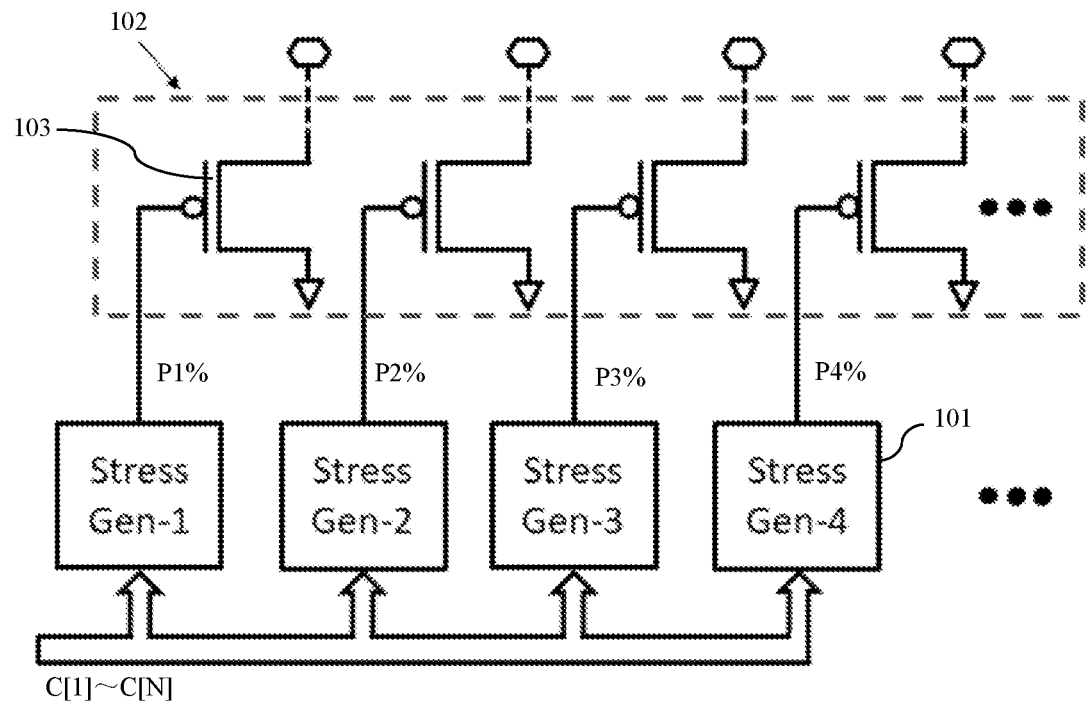
FIG. 1 is a block diagram of a circuit structure of a design-for-test circuit for evaluating a BTI effect according to an embodiment of the present application.

FIG. 1 is a block diagram of a circuit structure of a design-for-test circuit for evaluating a BTI effect according to an embodiment of the present application. The design-for-test circuit for evaluating a BTI effect according to the embodiment of the present application includes a plurality of stress generators 101.

In FIG. 1, the plurality of stress generators 101 are represented by Stress Gen-1, Stress Gen-2, Stress Gen-3, and Stress Gen-4, etc., and the specific number of the stress generators 101 can be configured as needed.

Each of the stress generators 101 includes a plurality of input ends and a plurality of output ends, and the output end of the stress generator 101 is connected to a gate of a corresponding device under test. In FIG. 1, each of the stress generators 101 has N input ends, wherein N is an integer greater than or equal to 2, and all the input ends are represented by C[1]—C[N]. There are a plurality of devices 103 under test, and the plurality of devices 103 under test are shown in the dashed lined box 102. All of the devices 103 under test are on-chip devices of a product chip.

Figure 2:
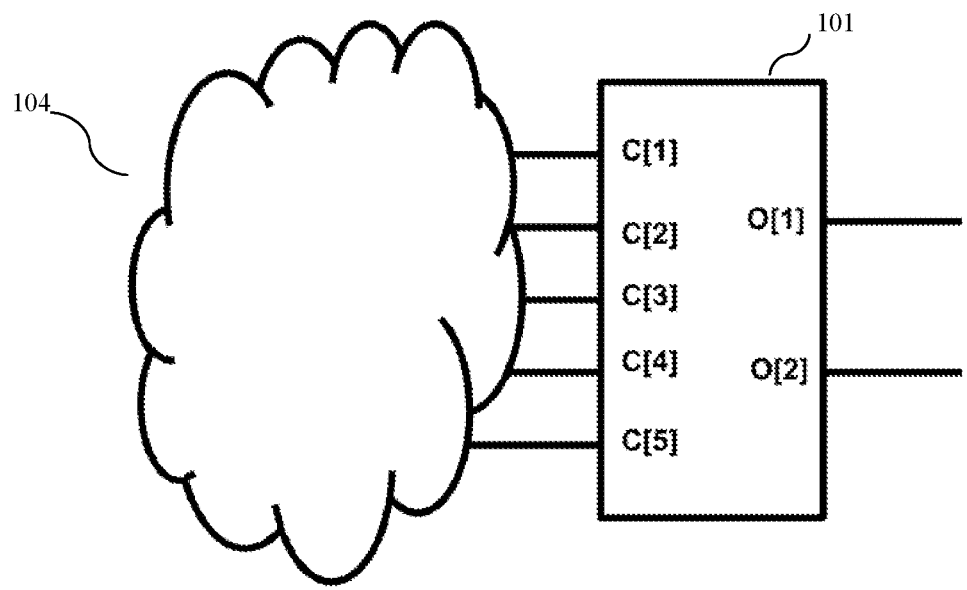
FIG. 2 is a schematic diagram of a connection structure of signals of input ends of a stress generator according to an embodiment of the present application.

Each of the stress generator 101 is a logic circuit, and signals of all the input ends of the stress generator 101 are logically combined to form signals of all the output ends. FIG. 2 is a schematic diagram of a connection structure of the signals of the input ends of the stress generator according to the embodiment of the present application. The signal of the input end of the stress generator is an input signal 104.

In the embodiment of the present application, the product chip is a memory chip. The input signal 104 in FIG. 2 is an address signal (Addres) of the memory chip. In other embodiments, the product chip is a logic chip, and the input signal 104 is provided by several input pins with highest and lowest signal variation frequencies in input pins. FIG. 2 shows five input ends, i.e., input ends C[1]—C[5], and two output ends, i.e., output ends O[1] and O[2].

Figure 3:
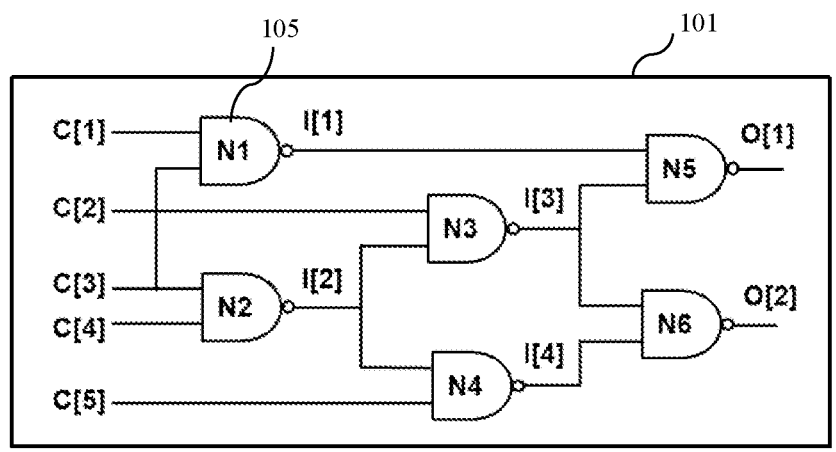
FIG. 3 is a diagram of an internal circuit of the stress generator according to an embodiment of the present application.

FIG. 3 is a diagram of an internal circuit of the stress generator according to the embodiment of the present application. The stress generator 101 is formed by connecting a plurality of NAND gates 105. FIG. 3 shows six NAND gates 105 which are represented by N1-N6, respectively, and output ends of the NAND gates 105 corresponding to N1-N4 are represented by I[1]-I[4], respectively. In other embodiments, the stress generator 101 may be formed by connecting a plurality of NOR gates, as long as a logical relationship between the signal of the input end and the signal of the output end of each stress generator 101 remains unchanged. Alternatively, the stress generator 101 is formed by connecting a plurality of NOR gates and NAND gates 105, as long as the logical relationship between the signal of the input end and the signal of the output end of the stress generator 101 remains unchanged.

In a stress mode, the signal of each input end of the stress generator 101 is a stress input signal, and the signal of each output end of the stress generator 101 is a stress output signal.

The stress input signal of each input end of the stress generator 101 is selected from a frequency signal, a first direct current voltage, and a second direct current voltage, the first direct current voltage has a first voltage value, the second direct current voltage has a second voltage value, the first voltage value is greater than the second voltage value, and the frequency signal switches between the first voltage value and the second voltage value and has a fixed duty cycle. In the frequency signal, the first voltage value is usually referred to as a high level, and the second voltage value is usually referred to as a low level.

The stress output signal of each output end of the stress generator 101 is one of a frequency signal, a first direct current voltage, and a second direct current voltage, and all the stress output signals formed by all the stress generators 101 include the first direct current voltage, a series of frequency signals with different duty cycles, and the second direct current voltage.

A stress voltage value of the device 103 under test that generates a stress action is the first voltage value or the second voltage value, and during a test, a stress time of each of the stress output signals regarding the device 103 under test is determined by a time occupied by the stress voltage value included in a test time. Since the stress output signals include the first direct current voltage, the series of frequency signals with different duty cycles, and the second direct current voltage, the stress time is related to the probability of occurrence of the stress voltage value in the stress output signal. For example: when the stress voltage value is the second voltage value, the probability of occurrence of the stress voltage value in the case where the stress output signal is the first direct current voltage is 0%; the probability of occurrence of the stress voltage value in the case where the stress output signal is the second direct current voltage is 100%; and the probability of the occurrence of the stress voltage value in the case where the stress output signal is a frequency signal becomes a duty cycle equal to the occurrence of the stress voltage value. The numbers P1%, P2%, P3%, and P4% etc. in FIG. 1 represent the probabilities of occurrence of the stress voltage value in different stress output signals, and the magnitude of the stress time is proportional to the probability.

All the stress output signals are used in combination such that the stress times regarding the device 103 under test within the same test time have a plurality of different values, so as to evaluate the BTI effect of the device 103 under test on the basis of different stress times.

In FIG. 1, all the devices 103 under test are PMOS transistors, the BTI effect is an NBTI effect, the stress voltage value is the second voltage value, and the second voltage value is less than or equal to 0 V. In other embodiments, the device 103 under test 103 is an NMOS, the BTI effect is a PBTI effect, the stress voltage value is the first voltage value, and the first voltage value is a positive voltage value.

The stress generator 101 further includes a measure mode. In the measure mode, the signal of each input end of the stress generator 101 is a test input signal, the signal of each output end of the stress generator 101 is a test output signal, and the test output signal is a switch signal. In the measure mode, all the stress generators 101 adopt the same test input signal and output the same test output signal.

During a switch-on test on the device 103 under test connected to the output end of the stress generator 101, the test output signals output by all the output ends of the same stress generator 101 are ON signals.

During a switch-off test on the device 103 under test connected to the output end of the stress generator 101, the test output signals output by all the output ends of the same stress generator 101 are OFF signals.

Figure 4:
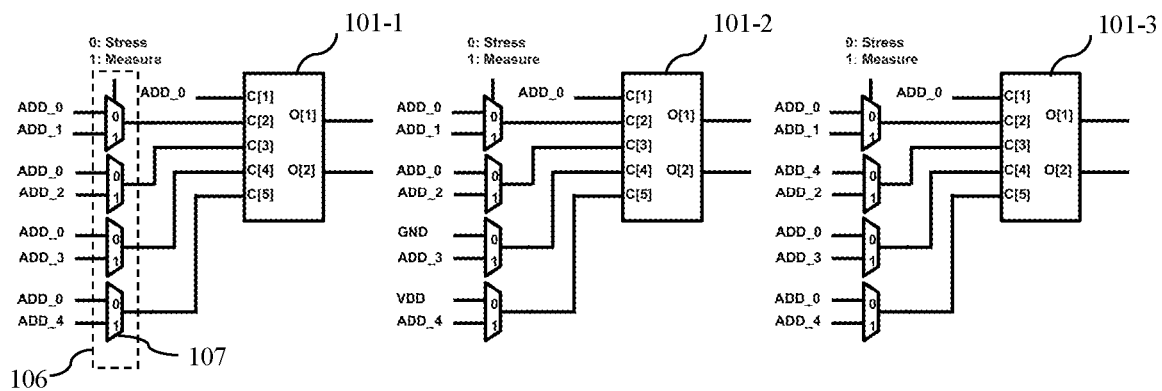
FIG. 4 is a diagram of the design-for-test circuit for evaluating a BTI effect which includes three stress generators with input ends signal connections, in a stress mode and a measure mode, according to an embodiment of the present application.

FIG. 4 is a diagram of the design-for-test circuit for evaluating a BTI effect which includes three stress generators 101 with input ends signal connections, in a stress mode and a measure mode, according to an embodiment of the present application. In the embodiment of the present application, both the test input signal and the stress input signal are provided by the input signal 104, while selection is achieved by a multiplexer 107, so as to input different signals in different modes. It can be seen from FIG. 4 that each input end of the stress generator 101 is provided with the multiplexer 107. The plurality of multiplexers 107 form a signal sampling and mode switching circuit 106. In the stress mode, the multiplexer 107 of the input end of the stress generator 101 connects the input end of the stress generator 101 with the stress input signal. In the measure mode, the multiplexer 107 of the input end of the stress generator 101 connects the input end of the stress generator 101 with the test input signal.

Since the input signal 104 in the embodiment of the present application is an address signal, both the stress input signal and the test input signal are obtained from the address signal. However, the frequency signal of the stress input signal is obtained by means of an increment or decrement of the address signal of the memory chip, that is, a change in the stress input signal is obtained from a change in the address signal. The test input signal is provided by the address signal of the memory chip. Since the test input signal only needs to control switch-on and switch-off states of the device 103 under test, when the device 103 under test is in a fixed switch-on state or fixed switch-off state, the test input signal is fixed so that the device 103 under test is kept in a state required by a fixed test.

FIG. 4 shows the three stress generators 101. In order to distinguish the three stress generators 101, the three stress generators 101 are numbered. The three numbered stress generators are represented by markers 101-1, 101-2, and 101-3 respectively, wherein the figure after 101 indicates the number. It can be seen from FIG. 4 that the multiplexer 107 is an either-or structure, and the entire signal sampling and mode switching circuit 106 adopts one selection signal to achieve switching of all the multiplexer 107 in the signal sampling and mode switching circuit 106. In FIG. 4, 0: Stress indicates that the stress mode is enabled when the selection signal is 0, and 1: Measure indicates that the measure mode is enabled when the selection signal is 1. A main function of the stress mode is generating different stress times for the device 103 under test such that the device 103 under test eventually have different degrees of characteristic drifts. A function of the measure mode is switching on or off the device 103 under test to measure the ON/OFF characteristics of the device 103 under test.

The address signal in the input signal 104 includes a plurality of bits. In FIG. 4, a 5-bit address signal is adopted, and the 5-bit address signal is represented by ADD_0, ADD_1, ADD_2, ADD_3, and ADD_4.

In FIG. 4, the input ends C[1] of the three stress generators 101-1, 101-2, and 101-3 are all connected to the signal ADD_0 and provided with no multiplexer 107.

The stress input signal is connected to a 0 input end of the multiplexer 107, and the test input signal is connected to a 1 input end of the multiplexer 107.

A connection of the stress input signal is described as in the following.

The 0 input ends of the four multiplexers 107 in the stress generator 101-1 are all connected to the signal ADD_0.

The 0 input ends of the multiplexers 107 corresponding to the input ends C[2] and C[3] in the stress generator 101-2 are both connected to the signal ADD_0, the 0 input end of the multiplexer 107 corresponding to the input terminal C[4] is connected to a ground signal GND, and the 0 input end of the multiplexer 107 corresponding to the input terminal C[5] is connected to an operating voltage VDD. The operating voltage VDD corresponds to a high-level voltage, i.e., the first direct current voltage, and the ground signal GND corresponds to a ground-level voltage, i.e., the second direct current voltage;

The 0 input ends of the multiplexers 107 corresponding to the input ends C[2], C[4], and C[5] of the stress generator 101-3 are all connected to the signal ADD_0, and the 0 input end of the multiplexer 107 corresponding to the input end C[3] is connected to the signal ADD_4.

According to a connection mode of the stress input signal in FIG. 4, after a normal increment or decrement of the address signal, the probability of generating an output 0 by the three stress generators 101-1, 101-2, and 101-3, i.e., the probability of occurrence of a stress voltage value corresponding to the PMOS transistor in the stress output signal, includes 0%, 25%, 50%, 75%, and 100%. Please refer to Table 1 for details:

TABLE 1

|  | C[1] | C[2] | C[3] | C[4] | C[5] | O[1] | O[2] |
|---|---|---|---|---|---|---|---|
| Vector-1 | 50.00% | 50.00% | 50.00% | 50.00% | 50.00% | 50.00% | 100.00% |
| Vector-2 | 50.00% | 50.00% | 50.00% | 100.00% | 0.00% | 50.00% | 0.00% |
| Vector-3 | 50.00% | 50.00% | 50.00% | 50.00% | 50.00% | 25.00% | 75.00% |

In Table 1, Vector-1 represents the probability of occurrence of a signal 0 at the input end and output end of the stress generator 101-1; Vector-2 represents the probability of occurrence of a signal 0 at the input end and output end of the stress generator 101-2; and Vector-3 represents the probability of occurrence of a signal 0 at the input end and output end of the stress generator 101-3.

Taking Vector-1 as an example, the input ends C[1]—C[5] of the stress generator 101-1 are all connected to the signa ADD_0, and after the increment or decrement of the address signal, the probability of the signal ADD_0 being at a low level, i.e., being 0, is 50.00%. Therefore, in Table 1, the values of input ends C[1]-C[5] are all 50.00%. According to a specific logic circuit corresponding to FIG. 3, the input ends C[1]—C[5] are logically combined to obtain signals of the output ends O[1] and O[2]. It can be found that the probability of the output end O[1] being 0 is 50.00%, that is, half of the time the output end O[1] is at a low level and the other half at a high level, and the probability of the output end O[2] being 0 is 100.00%, that is, the output end O[2] is always at a low level.

A difference between Vector-2 and Vector-1 is that the probability of C[4] in Vector-2 being 0 remains 100% and the probability of C[5] being 0 remains 0.00%. As C[4] of the stress generator 101-2 is connected to the ground signal GND, the probability of C[4] being 0 is 100.00%. As C[5] is connected to the operating voltage VDD, C[5] cannot be 0, that is, the probability of being 0 is 0.00%.

A difference between Vector-3 and Vector-1 is that the signal connected to C[3] is ADD_4, and an address change of ADD_4 is asynchronous with that of ADD_0. Therefore, although the probability of occurrence of 0 in ADD_4 is also 50.00%, after a logic operation of the logic circuit shown in FIG. 3, the probability of occurrence of 0 at the two output ends O[1] and O[2] changes to 25.00% and 75.00%, respectively.

In Table 1, although the probability of occurrence of a low level in the signal ADD_0 is 50.00%, the probability of occurrence of a low level in the signal ADD_0 can also be set to other values, which can be achieved by changing a duty cycle of the signal ADD_0, eventually adjusting the stress time by adjusting the duty cycle of the input signal 104.

A connection of the test input signal is as follows:

1 input ends of the multiplexers 107 corresponding to the input ends C[2], C[3], C[4], and C[5] of each of the three stress generators 101-1, 101-2, and 101-are connected to the signals ADD_1 to ADD_4, respectively.

The test input signal needs to be configured according to a switch state of the device 103 under test during the test, for example, configured according to Table 2:

TABLE 2

| C[1] | C[2] | C[3] | C[4] | C[5] | O[1] | O[2] |
|---|---|---|---|---|---|---|
| 0 | 0 | 0 | 0 | 0 | 0 | 0 |
| 0 | 0 | 0 | 0 | 1 | 0 | 1 |

TABLE 2-continued

| C[1] | C[2] | C[3] | C[4] | C[5] | O[1] | O[2] |
|---|---|---|---|---|---|---|
| 1 | 1 | 1 | 1 | 1 | 1 | 0 |
| 0 | 1 | 0 | 0 | 0 | 1 | 1 |

Table 2 shows four output states of the output ends O[1] and O[2] and corresponding configured values of the input ends C[1] to C[5]. The output ends O[1] and O[2] can each be connected to the gate of one of the devices 103 under test and the types of the devices 103 under test are generally the same. Therefore, when the output states of the output terminals O[1] and O[2] are the same, the same control is performed on the device 103 under test. In this case, the output ends O[1] and O[2] being both 0 or both 1 is a desired output state, and the output ends O[1] and O[2] being respectively 0 and 1 or respectively 1 and 0 is a reserved state, which cannot be adopted during the test.

For the device 103 under test which is a PMOS transistor, when the output ends OW and O[2] are both 0, it corresponds to an ON signal of the PMOS transistor, i.e., a switch-on control signal, and in this case, a test for a switch-on electrical parameter of the PMOS tube can be performed, such as an IV test. When the output terminals O[1] and O[2] are both 1, it corresponds to an OFF signal of the PMOS transistor.

The embodiment of the present application can also evaluate the PBTI effect of the NMOS transistor.

The stress action and the test on the device 103 under test in the embodiment of the present application are both performed on a chip.

The design-for-test circuit of the embodiment of the present application is directly disposed on the product chip where the device 103 under test is located; or the design-for-test circuit is disposed on a process control monitor (PCM) module.

In the measure mode, a source, a drain, and a substrate of each of the devices 103 under test are all grounded.

Figure 5:
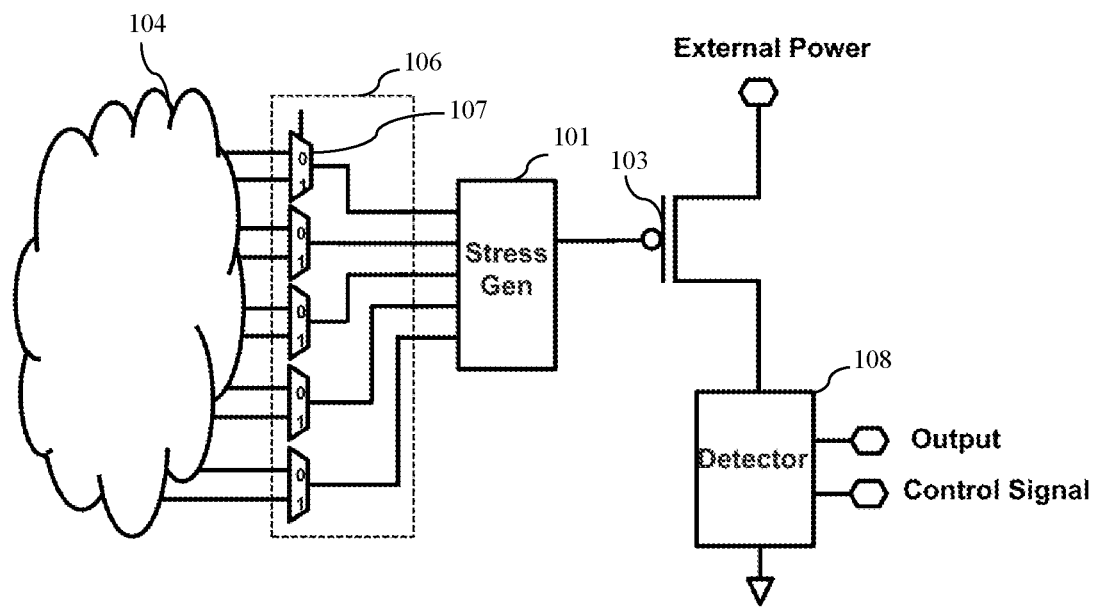
FIG. 5 is a schematic circuit diagram of the design-for-test circuit for evaluating the BTI effect including a detector according to an embodiment of the present application.

FIG. 5 is a schematic circuit diagram of the design-for-test circuit for evaluating a BTI effect including a detector 108 according to the embodiment of the present application. In the measure mode, the source of each of the devices 103 under test is connected to an external power, the drain of each of the devices 103 under test is connected to a detector 108, and the detector is used to detect a drain current of the device 103 under test. The detector 108 in FIG. 5 is represented by Detector, and is used to implement aging detection, i.e., the evaluation of the NBTI effect. A control end of the detector 108 is connected to a control signal Control Signal and an output end of the same is connected to an output signal Output.

Figure 6:
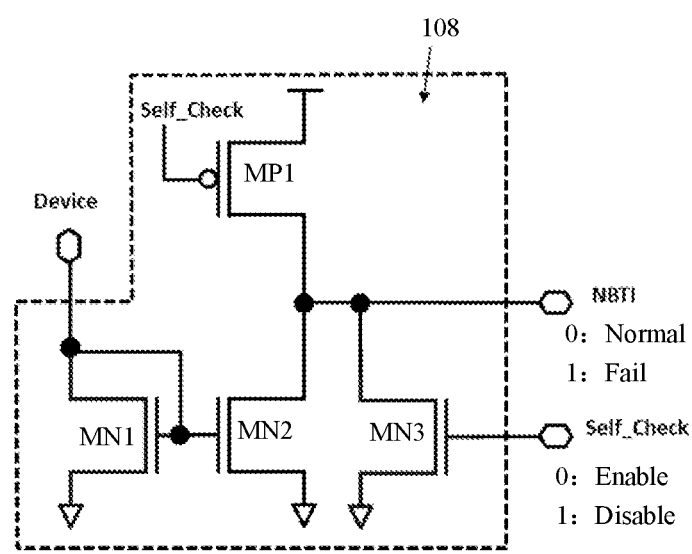
FIG. 6 is the schematic circuit diagram of the detector in FIG. 5.

FIG. 6 is a schematic circuit diagram of the detector 108 in FIG. 5. The drain of the NMOS transistor MN1 is connected to the drain of a device Device, i.e., the device 103 under test, and the source of the NMOS transistor MN1 is grounded. The NMOS transistors MN2 and MN1 form a mirror circuit, and the PMOS transistor MP1 and the NMOS transistor MN2 form a current comparator. The output signal Output is a signal NBTI, 0:Normal indicates that when the signal NBTI is 0, the device 103 under test is normal; and 1: Fail indicates that when the signal NBTI is 1, the device103 under test is abnormal.

The control signal Control Signal is a signal Self_Check, and the signal Self_Check is connected to both the gate of the NMOS transistor MN3 and the gate of the PMOS transistor MP1. 0: Enable indicates that the detector 108 is enabled when the signal Self_Check is 0; and 1: disable indicates that the detector 108 is disabled when the signal Self_Check is 1.

The embodiment of the present application can be directly implanted in a memory or a logic chip, and can also be placed in a process control monitor (PCM) module.

The embodiments of the present application can be used to evaluate and test the on-chip PMOS NBTI and NMOS PBTI of the above-mentioned products.

The embodiments of the present application can generate a signal of a device drift or failure in a test during burn-in (TDBI), so as to feed back an accurate failure time. The signal Self-Check in FIG. 6 can be generated by the chip itself or controlled by an external command.

The design-for-test circuit for evaluating a BTI effect provided by the embodiment of the present application includes a plurality of stress generators 101. In the stress mode, the stress input signal is a variable signal, the stress input signals are logically combined to obtain the stress output signals, and the plurality of stress generators 101 can obtain a variety of stress output signals. The probabilities of occurrence of the stress voltage value in different stress output signals are different, so as to obtain a plurality of different stress times within the same test time. The different stress times are generated such that on-chip stress can be implemented on the device 103 under test in a plurality of stress time conditions within the same test time, facilitating evaluation of the BTI effect and determination of a device function failure cause.

The present application is described in detail above by using specific embodiments, which, however, are not intended to limit the present application. Without departing from the principles of the present application, those skilled in the art can also make many modifications and improvements, which should also be regarded as within the scope of protection of the present application.

What is claimed is:

1. A design-for-test circuit for evaluating a bias temperature instability (BTI) effect on a device under test, comprising:

a plurality of stress generators, wherein each of the plurality of stress generators comprises a plurality of input ends and a plurality of output ends, wherein one of the plurality of the output ends of the plurality of stress generators is connected to a gate of the device under test;

wherein the plurality of stress generators is a logic circuit, wherein signals of all the plurality of input ends of the plurality of stress generators are logically combined to form signals of all the plurality of output ends;

wherein in a stress mode, each signal of each of the plurality of input ends of the plurality of stress generators is a stress input signal, and each signal of each of the plurality of output ends of the plurality of stress generators is a stress output signal;

wherein the stress input signal of each of the plurality of input ends of the plurality of stress generators is selected from a frequency signal, a first voltage, or a second voltage, wherein the first voltage value is greater than the second voltage value, and wherein the frequency signal switches between the first voltage and the second voltage value and wherein the frequency signal has a fixed duty cycle;

wherein the stress output signals of the output ends of the plurality of stress generators comprise one of a series of frequency signals, the first voltage, and the second voltage, wherein the series of frequency signals comprise different duty cycles;

wherein a stress voltage is a voltage generating a stress on the device under test, and wherein during a test, stress times of the stress output signals on the device under test are determined by a time applying the stress voltage; and wherein the stress output signals having different values within a same test time are combined, so as to evaluate the BTI effect of the device under test.

2. The design-for-test circuit for evaluating the BTI effect according to claim 1, wherein if the device under test is a PMOS transistor, the stress voltage is the second voltage, and wherein the second voltage is negative or equal to 0 V, and the BTI effect is a negative BTI effect (NBTI).

3. The design-for-test circuit for evaluating the BTI effect according to claim 1, wherein if the device under test is an NMOS transistor, the stress voltage is the first voltage, and wherein the first voltage is a positive voltage, and the BTI effect is a positive BTI effect (PBTI).

4. The design-for-test circuit for evaluating the BTI effect according to claim 1, wherein in a measure mode, the input signal of each of the plurality of input ends of one of the plurality of stress generators is a test input signal, and the output signal of each of the plurality of output ends of one of the plurality of stress generators is a test output signal, wherein the test output signal is a switch signal.

5. The design-for-test circuit for evaluating the BTI effect according to claim 4, wherein during a switch-on test on the device under test connected to one of the plurality of output ends of one of the plurality of stress generators, the test output signal from all the plurality of output ends of a same one of the plurality of stress generators are switch-on signals;

and wherein during a switch-off test on the device under test connected to one of the plurality of output ends of one of the plurality of stress generators, the test output signal from all of the plurality of output ends of a same one of the plurality of stress generators are OFF signals.

6. The design-for-test circuit for evaluating the BTI effect according to claim 4, wherein in the measure mode, all of the plurality of stress generators adopt a same test input signal and output a same test output signal.

7. The design-for-test circuit for evaluating the BTI effect according to claim 4, wherein each of the plurality of input ends of one of the plurality of stress generators is provided with a multiplexer;

wherein in the stress mode, said multiplexer connects said one of the plurality of input ends of said one of the plurality of stress generators with the stress input signal; and wherein in the measure mode, said multiplexer connects said one of the plurality of input ends of said one of the plurality of stress generators with the test input signal.

8. The design-for-test circuit for evaluating the BTI effect according to claim 7, wherein the device under test is an on-chip device of a product chip.

9. The design-for-test circuit for evaluating the BTI effect according to claim 8, wherein the product chip is a memory chip;

wherein the memory chip has an address number;

wherein one of the series of frequency signals from said stress input signal is obtained by an increment or a decrement of the address number of the memory chip; and wherein the test input signal is provided from the address number of the memory chip.

10. The design-for-test circuit for evaluating the BTI effect according to claim 8, wherein the product chip is a logic chip, wherein the logic chip has an input pin carrying a variable signal, wherein the stress input signal is provided by several input pins with highest and lowest signal variation frequencies in the input pins, and wherein the test input signal is provided by selecting several input pins with a highest and a lowest signal variation frequencies in the several input pins.

11. The design-for-test circuit for evaluating the BTI effect according to claim 8, wherein the design-for-test circuit is directly configured on the product chip where the device under test is located; or the design-for-test circuit is configured on a process control monitor (PCM) module.

12. The design-for-test circuit for evaluating the BTI effect according to claim 8, wherein the stress and the test on the device under test are performed on the product chip.

13. The design-for-test circuit for evaluating the BTI effect according to claim 1, wherein the device under test comprises a source and a drain, wherein in a measure mode, the source of the device under test is connected to an external power, the drain of the device under test is connected to a detector.

14. The design-for-test circuit for evaluating the BTI effect according to claim 1, wherein the plurality of stress generators is formed by connecting a plurality of NAND gates;

or the plurality of stress generators is formed by connecting a plurality of NOR gates; or the plurality of stress generators is formed by connecting a plurality of NOR gates and NAND gates.

* * * * *